United States Patent [19]

Schupak

[11] Patent Number: 5,414,392
[45] Date of Patent: May 9, 1995

[54] AMPLIFIER CIRCUIT

[75] Inventor: Leonard Schupak, Irving, Calif.

[73] Assignee: MedCom Electronics, Beverly Hills, Calif.

[21] Appl. No.: 112,194

[22] Filed: Aug. 26, 1993

[51] Int. Cl.$^6$ .............................................. H03C 3/00
[52] U.S. Cl. ................................... 332/118; 332/117;
128/902; 128/903; 128/904; 331/65; 331/108
B; 331/183; 331/132; 331/177 R; 455/100;
455/110
[58] Field of Search ............... 332/117, 118, 123, 124,
332/126; 331/108 B, 65, 135, 109, 115, 108 R,
183, 177 R, 45; 340/870.07, 870.11, 870.18;
455/42, 43, 110, 100; 128/701, 902, 904, 696,
700, 903

[56] References Cited
U.S. PATENT DOCUMENTS

| 3,809,071 | 5/1974 | Davolos et al. | 128/902 X |
| 3,826,999 | 7/1974 | Williford | 331/136 |
| 4,223,679 | 9/1980 | Schulman et al. | 128/697 X |
| 4,281,664 | 8/1981 | Duggan | 128/903 X |
| 4,760,353 | 7/1988 | Perkins | 331/132 |

Primary Examiner—Robert J. Pascal
Assistant Examiner—Arnold Kinkead
Attorney, Agent, or Firm—Merchant, Gould, Smith, Edell, Welter & Schmidt

[57] ABSTRACT

An electrical circuit comprising means for receiving an input signal for encoding or modulating and amplification. Multiple amplification stages including at least one transconductance amplifier are provided. There are means for having the input signal modulate the oscillator constituted by the multiple amplification stages to provide a 360° phase-shifted signal at a predetermined frequency. Gain control means are also provided for developing level for permitting oscillation under conditions including at least the conditions of turn on of the circuit and other operating conditions. The gain control means includes a transistor and resistor network for adjusting the gain to sustain the oscillation. The transistor and resistor also regulate amplification of an intermediate stage of the amplifier. The preamplifier directly converts an EKG and/or other signals to linearized control currents which modulate the oscillator.

31 Claims, 4 Drawing Sheets

AMPLIFIER CIRCUIT

BACKGROUND OF THE INVENTION

Amplifying electrical signals using minimum power and with physically small circuitry components is valuable.

There is a need to obtain data such as medical data by monitoring subjects in a manner which minimizes discomfort of the patient. To date, it is very difficult to effectively obtain such data and transmit the data by an RF signal for further processing at a remote location, because of power requirements, power line noise and other interfering signals.

The circuitry of the invention is for obtaining signals such as EKG signals from patients, with a particular emphasis on infant children. These signals must be amplified and transmitted to a remote, namely, wireless receiver for further processing. Furthermore, the signal conditioner must operate at very low power because of battery and safety considerations.

SUMMARY OF THE INVENTION

The current invention specifically seeks to meet all of these requirements.

According to the invention, an electrical circuit comprises means for receiving an input signal for encoding or modulating and amplification. This input signal is encoded in a format suitable for transmission to a remote receiver. Amplification means includes multiple amplification stages consisting of tranconductance amplifiers with suitable external components, are provided for amplifying the input signals. There is means for providing a 360° phase-shifted signal at a predetermined frequency. Feedback means sustains oscillation in the multiple amplification stages at the predetermined frequency and there is an output signal from the final stage at the predetermined frequency.

Another aspect of the invention is the provision of gain control means for developing a controlled level for permitting and maintaining oscillation under conditions including at least the conditions of turn on of the circuit and other operating conditions, such as variations in temperature and power supply voltage. The gain control means includes a transistor and resistor network for adjusting the gain to sustain the oscillation. This transistor and resistor regulates amplification of an intermediate stage of the amplifier.

An FM/FM telemetry channel is used for wireless transmission of the amplified and encoded signal. This invention is directed to an oscillation circuit and a monitoring system using the oscillation circuit. Where there are several data channels of communication, a multiplexed combination of subcarrier oscillators at different frequencies can be used. In order to separate these subcarriers at the receiver terminal, each oscillator is independent and separable. This is accomplished simply by operating each oscillator at a different frequency. Because the oscillator signal is a low distortion sine wave in a predetermined frequency, range, they can be separated by conventional filtering means.

In a preferred form of the invention, the circuit is an oscillator of the phase shift type, having three stages of amplification and suitable means to provide exactly 360° of phase shift at a specific frequency. These amplifier stages include two integrators in series and an output amplifier.

A further aspect of the invention is an oscillator circuit whose gain stages are configured to provide exactly 360° of phase shift at a controllable frequency, where the frequency is determined by a second external signal, namely a MIRROR REFERENCE.

The oscillator circuit includes a gain control mechanism, consisting of a transistor and resistor which adjusts the net gain to exactly that amount required to sustain oscillation at a constant amplitude without distortion. This circuit further has the ability to control the oscillator signal amplitude in accordance with an external or internal signal. This gain control is obtained by a second feedback path, independent of the main network.

The gain control adjusts the oscillator operating conditions such that the oscillator generates two sinusoidal waveforms, in quadrature. The waveform purity is such that harmonic distortion is reduced to very low levels.

A preamplifier directly provides the control signal (MIRROR REFERENCE) to vary the oscillator frequency in a linear manner to provide the FM characteristics necessary to implement the FM/FM telemetry link.

Further, the preamplifier obtains an EKG signal and converts it to a suitable modulating or encoding signal to modulate the oscillator frequency, such that the frequency deviation is proportional to the EKG signal.

The preamplifier directly converts the EKG and/or other signals to linearized control currents which modulate the oscillator frequency substantially independent of the temperature of the semiconductors.

The preamplifier includes control means for modulation by a secondary low frequency signal. This in turn, introduces a low frequency, or fixed offset, signal in the subcarrier output which can be used to multiplex this secondary signal directly with the EKG signal.

The invention further relates to amplifier stages which are based on transconductance control to implement each of the circuit elements.

The amplifier stages consisting of PNP and NPN bipolar transistors can be fabricated in an integrated circuit to obtain features of matched gain and temperature coefficients necessary to maintain proper circuit performance.

DESCRIPTION OF THE PREFERRED EMBODIMENT

Figure 1:
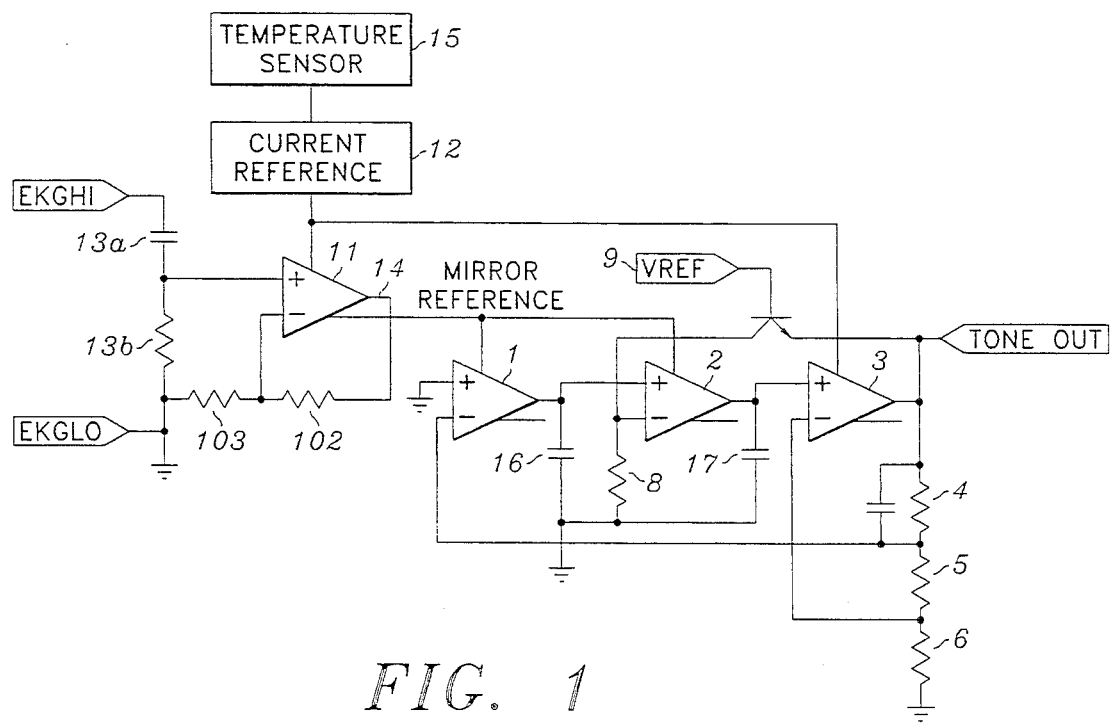
FIG. 1 is a block diagram of the complete system with a preamplifier, two integrating amplifiers, and an output amplifier.

A block diagram of the electrical circuit is depicted in FIG. 1. Multiple stages of amplification are constituted by four similar gain stages. There is a single preamp stage 11 whose input signal is derived from an EKG signal through a high pass filter 13, composed of capacitor 13a and resistor 13b followed by two gain controlled integrators 1 and 2 and an output amplifier, 3. EKGHI, 100, and EKGLO, 101 are the connections for the signal derived from electrodes connected to the subject. The output signal, indicated by TONE OUT is a sine wave subcarrier that is frequency modulated by the EKG signal.

The preamplifier 11 has an auxiliary output, MIRROR REFERENCE 10, in addition to its linear output 14. The MIRROR REFERENCE 10 is used to set the operating point, namely the gain, of the integrators 1 and 2. Additional external elements, capacitors 16 and 17, and VREF 9 are used to set initial operating conditions, such as center frequency and amplitude.

In addition there is a level control loop, consisting of resistor 8 and transistor 7 which modifies the gain of the second integrator 2.

The linear output terminal, 14 sets the preamplifier operating conditions, using a feedback network to maintain operation in its linear region. The preamplifier gain is further controlled by an external thermistor or other temperature sensing element 15 controlling the CURRENT REFERENCE 12, independent of the linear signal, so that the average magnitude of MIRROR REFERENCE 10 is proportional to temperature.

Preamplifier (11)

Figure 2:
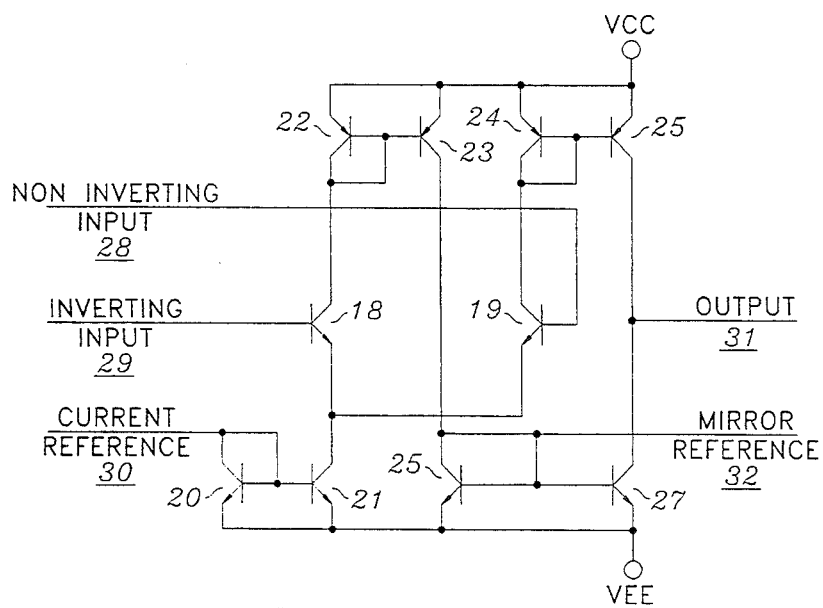
FIG. 2 is the circuit of a transconductance amplifier as used in the preamplifier. The other amplifiers use the transconductance amplifier suitably modified, as described later.

The preamplifier 11 uses the transconductance amplifier illustrated in FIG. 2, with external resistors 102 and 103 and the other components to implement an amplifier which provides linear base band gain in addition to the MIRROR REFERENCE signal. The Linear output is independent of the magnitude of the CURRENT REFERENCE signal, while MIRROR REFERENCE is a function of the sum of these two signals (EKGHI-EKGLO plus current reference). This is obtained as follows:

The voltage developed across transistor 20 is defined by the diode equation:

$$\frac{I_o}{I_s} = e^{\frac{qV_b}{kT}} - 1$$

Where:
$I_o$ is the collector current of 20 or 21
$I_s$ is its saturation current, a basic transistor parameter
$V_b$ is the base emitter voltage
T is the device temperature, and the other parameters are basic physical constants.

Transistor 20, connected as a "quasi diode" (collector tied to base) biases transistor 21 and the output amplifier so that the collector current ($I_o$) of transistor 21 is equal in magnitude to the collector current $I_o$ of transistor 20. This occurs because the base emitter voltages ($V_b$) for each transistor are the same. This implies that the collector and emitter currents are the same.

The input stage of the preamplifier consists of a conventional differential amplifier comprised of transistors 18 and 19 whose operating current is therefore determined by current mirror transistors 20 and 21. In this circuit, transistor 21 derives its Bias Current from the CURRENT REFERENCE. The output of the differential pair is reflected by three additional current mirrors, including; transistor pairs, 22 and 23, which constitute an intermediate gain stage and level translator at the positive rail; transistors 24 and 25, a positive output mirror stage; and transistors 26 and 27, the negative output mirror stage. The current in the amplifier output 31 is the algebraic sum of the currents from each mirror current output stage. MIRROR REFERENCE, which is subsequently used to set the operating bias current of integrators 1 and 2, is a voltage determined by the current in the negative output mirror stage.

Consideration of Kirchoff's laws and feedback theory shows that the output current is equal to the input signal [EKGHI-EKGLO] divided by the value of resistor 103. This current can be shown to be twice the current of transistor 26. The voltage across transistor 26 can then be determined using the previous diode equation.

Oscillator (Integrators 1 and 2, and Output Amplifier 3)

The oscillator consists of integrators 1 and 2, and output amplifier 3. Each integrator uses the same transconductance amplifier, described above, except that transistor 20 is not present. The bias for each stages, namely the MIRROR REFERENCE, is derived from transistor 26 of the preamp stage. This current then determines the transconductance $g_m$ of the amplifier, stages, and the output current is the differential input times the $g_m$.

This current flows into the load capacitances 16 and 17, respectively, which integrates the total output current.

Integrator Operation

It can be shown using conventional analysis, that the circuit has a DC stable operating point and will oscillate at a frequency determined by the transconductance and capacitance, where the magnitude of gain is unity in the integrator stages. This oscillation will start at the condition of power-on and build up linearly if no further restraints are applied. The maximum oscillation amplitude would be determined by circuit parameters.

The amplifier transconductance at room temperature is:

$$G_m = \frac{q^* I_e}{k^* T} \approx 19.2^* I_e$$

where Ie is the reference current in milliamperes. This produces an output current equal to the product of transconductance times the differential input voltage.

$$I_o = G_m V_s$$

The output current produces a voltage across the capacitors 16 and 17 which can be defined using a differential equation (calculus format) or a LaPlace transform of that equation. Each of these expressions provides an insight to the behavior of the circuit. The voltage across the capacitor is the integral of the current:

$$V_0 = \frac{1}{c} \int I_o dt = \frac{Gm}{c} \int V_s dt$$

and the transform:

$$V_0 = \frac{Gm V_s}{sC}$$

These terms can be arranged to express a "gain" relationship:

$$\frac{V_o}{V_S} = \frac{Gm}{sC}$$

Using the feedback theory, the open loop gain of the three stages is determined. The first stage, 1 is an "inverting" integrator, the second stage, 2 is non-inverting, and the third stage, 3 is a straight amplifier whose applicable output voltage is the output current times resistors 5 and 6. The open loop gain is:

$$Fout = -\left(\frac{Gm}{sC}\right)^2 \times Gm(R5 + R6) \times Vm$$

This is equal to 1 after loop is closed.

The loop is closed and the LaPlace transform equation is solved. The solution is in the form of a sine wave whose amplitude increases linearly with time. The frequency is determined by the transconductance/capacitance ratio; and the rate of amplitude increase is determined by the excess gain.

If $V_m$=Fout $$1+(Gm/sC)^2 Gn(R_5+R_6)=0$$

$$Fout \alpha [Gm(R_5+R_6)-1]t \times \sin(Gmt/cC)$$

for $Gm(R_5+R_c)>1$

Transistor 7 modifies the gain of amplifier 2 by reducing its differential input voltage when the output amplitude exceeds VREF. This can be considered as a nonlinear phenomenon. The gain is modulated as a time varying function. The circuit equations are solved as if there were a new set of initial conditions each time transistor 7 was turned on.

The output level is maintained by transistor 7, as follows. When the output at TONE OUT is more positive than the reference voltage 9, transistor 7 is off and no current flows in resistor 8. As the signal goes more negative, transistor 7 starts to conduct and causes the voltage at resistor 8 to go negative also. This negative voltage is in the same direction as the voltage on capacitor 16, resulting in a smaller differential voltage at the input to integrator 2. Because this action takes place within a closed loop feedback network, the effect is to maintain the overall gain at exactly unity when the sinewave signal amplitude is such that conduction occurs at the negative peak of the signal.

Output Amplifier (3)

The two integrators 1 and 2, connected as shown in FIG. 1 are combined with the output amplifier 3, which uses the same transconductance amplifier as shown in FIG. 2 except with an additional resistive load.

The resistive load is constituted by a resistor network 4, 5 and 6 which performs three functions.

1. The amplifier stage 3 provides a gain of approximately 20 to obtain a suitable output level for subsequent signal processing, including the drive signal to the aforementioned level control.

2. The resistors 4, 5 and 6 provide local feedback to raise the input impedance presented to the previous stage.

3. A tap between resistor 5 and 6 provides gain slightly greater than one, This is used to feed back the amplified and integrated signal. This excess gain provides the necessary margin required to sustain oscillation.

Integrated Circuit

Figure 3:
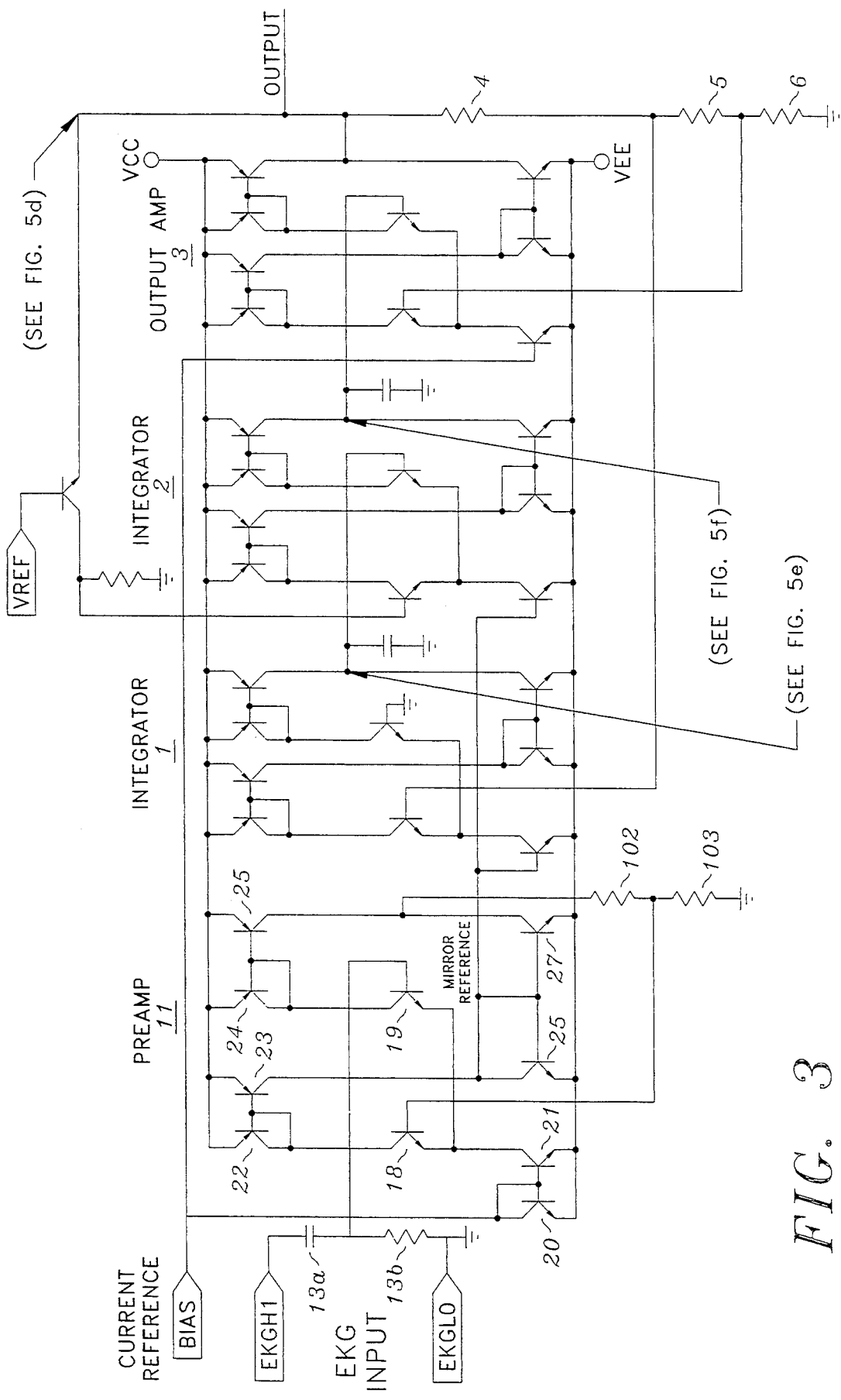
FIG. 3 is a schematic of the subcarrier oscillator in a form suitable to integration in a small custom integrated circuit.

The subcarrier oscillator in integrated circuit form ("IC") is shown in FIG. 3. This circuit operates on a very low supply voltage, at microampere or fractional microampere current levels ($I_O$).

The IC can include a precision current source and multiplexer. These components can be used for many functions, including direct measurement of skin resistance between the EKG electrodes. The circuit can also provide capability for internal or external amplitude control. This control could then be used to superpose an amplitude modulation component at a lower carrier frequency. This provides an additional continuous data channel without any additional bandwidth requirement.

For a construction using discrete components, the following parts and values might be used:

| NPN transistors: | 7, 18, 19, 20, 21, 26, 27 | | 2N3904 |
|---|---|---|---|
| PNP transistors: | 22, 23, 24, 25 | | 2N3906 |
| Capacitors: | | | |
| 13A, 16, 17 | 0.1 μF. | | |
| Resistors: | | | |
| 13B  1.5MegΩ; | 102  2KΩ; | 103 | 200KΩ; |
| 4  220KΩ; | 5  1KΩ; | 6 | 10KΩ; |
| Reference current to preamp 2 μA | | | |

MIRROR CURRENT setting 1.0 μA typical+-modulation component. The mirror voltage is present on this "bus" wire, which sets the transistor 21 current of the following stages to the specified value, in accordance with the previously described equation or relationship.

Waveforms

Figure 5A:
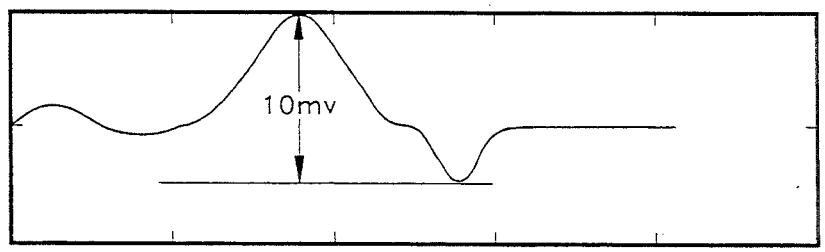
FIGS. 5a to 5f are graphical representations of an input EKG signal waveform, MIRROR REFERENCE signal waveform, and oscillator signals through the stages, and output waveform.
Figure 5B:
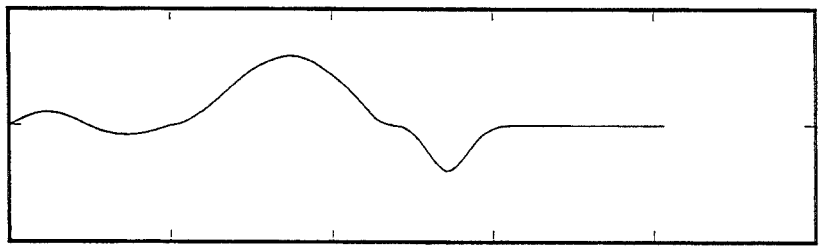

In FIG. 5a, there is an EKG signal represented by input between EKGHI and EKGLO. From peak-to-peak, the approximate voltage is about 10 mV. The period of the wave is about 1 second. This signal is amplified and appears at MIRROR REFERENCE, illustrated in FIG. 5b. This wave is about 0.5 volt at the reference line and the peak-to-peak is about 0.05 volts. The peak regions get relatively compressed.

Figure 5C:
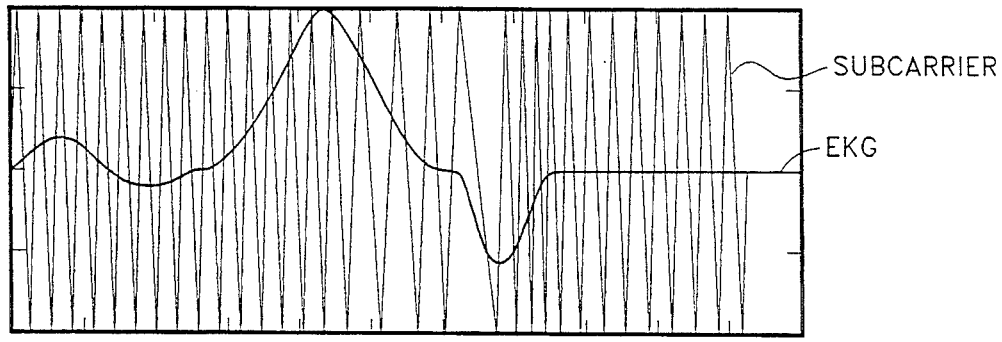
Figure 5D:
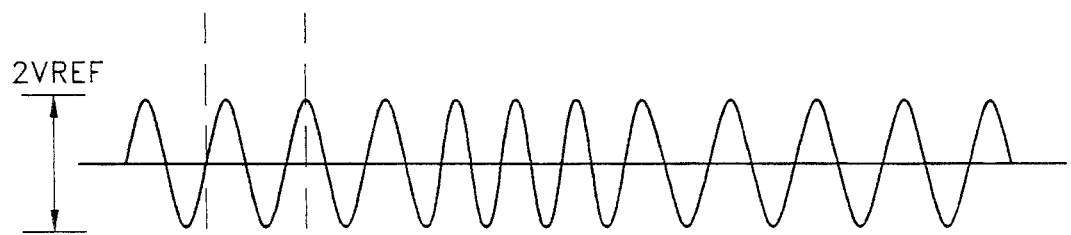
Figure 5E:
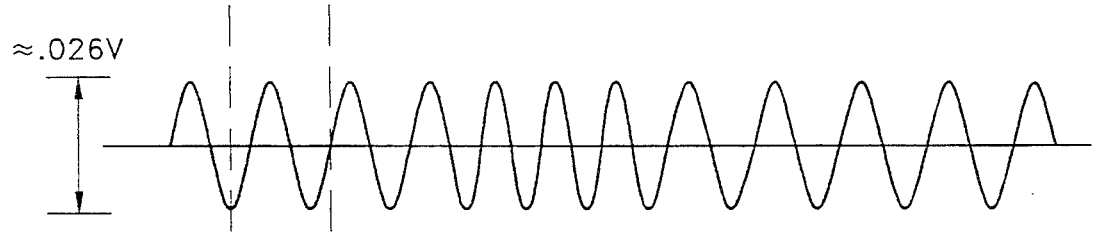
Figure 5F:
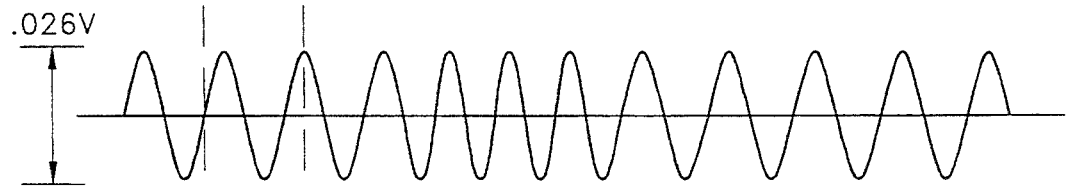

The representation of the modulation current in FIG. 5c depicts the QRS portion of the Mirror Reference voltage of the EKG, and its effect on the sine wave carrier output.

This QRS modulating signal develops a sinusoidal waveform at the TONE OUT terminal as represented in FIG. 5c, which has a range of about 2 volts peak-to-peak and is frequency modulated. When the modulation component is positive, the frequency increases as indicated. When the modulation component decreases, the frequency decreases.

Transmitter System

Figure 4:
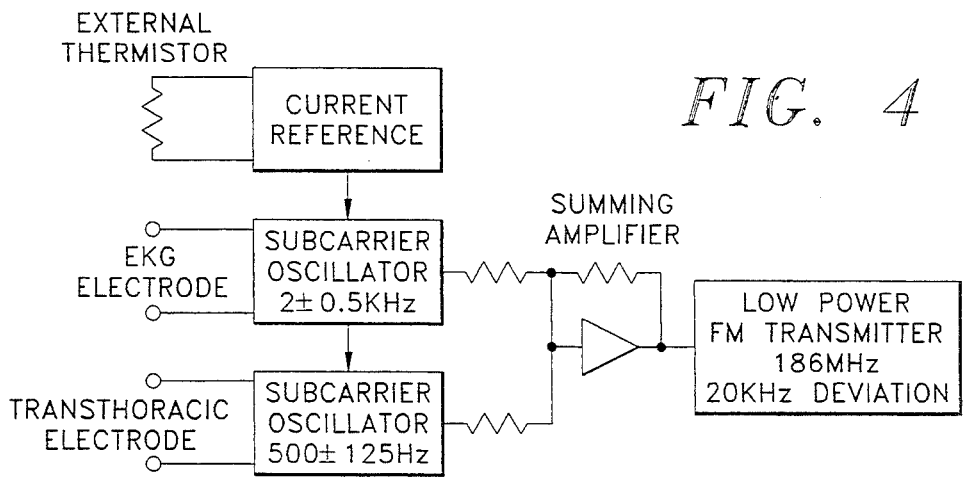
FIG. 4 shows a transmission system connected with multiple subcarrier oscillators arranged to measure three typical parameters.

FIG. 4 shows a system which provides two separate subcarrier oscillator channels as shown in FIG. 3. These are combined in a summing amplifier 50 as a frequency division multiplexed (FDM) channel feeding an FM radio transmitter 51.

This system can be used as an isolated medical monitoring system, which can provide three separate functions.

The EKG signal from electrodes 53 modulates a 2 KHz subcarrier to a deviation of ±500 Hz. The center frequency is determined by the bias current of preamplifier 11, which is determined by the reference current source. This source in turn is controlled by a thermistor 52 and current reference 15, which varies the "long term" average frequency in accordance with the patient's temperature.

Temperature data and EKG data can be combined on a single subcarrier in this manner because the EKG is an AC phenomenon and temperature from sensor 52 is a slowly varying or DC phenomenon.

The third channel measures respiration using a technique of measuring the transthoracic resistance. This is done by setting the bias current 12 of a second oscillator also inversely proportional to the resistance measured between a second pair of electrodes 54. Such a second oscillation would be a configuration of FIG. 3. The subcarrier oscillator then produces a 500 Hz sinewave which is deviated ±125 Hz.

The outputs of each oscillator can be summed at amplifier 50 in a linear network without interfering with each other, because they occupy completely separate portions of the modulation bandwidth. The summed output is then used to modulate a 186 MHz FM radio transmitter 51, which relays the signals through antenna 55 to a remote monitoring or receiving station.

This configuration, which uses battery power for the complete unit, allows a patient complete freedom of movement, and eliminates the need for common mode rejection, which occurs when the commercial power line is used, in the amplifier circuits. That is, the battery powered unit uses a ground potential established directly on the patient, and floats at this point with respect to power line ground.

The circuits of FIGS. 1 through 3 use bipolar NPN and PNP transistors as active circuit elements. The same circuits may be implemented using Complementary MOS transistors, since the current mirror operation can be shown to be analogous.

Many other forms of the invention exist, each differing from others in matters of detail only. The invention is to be determined solely by the following claims.

I claim:

1. An electrical circuit comprising:
    means for receiving an input signal for amplification;
    amplification means including a transconductance amplifier for amplifying the input signal;
    means for having the input signal modulate the amplification means by varying the transconductance of the amplification means to provide a 360° phase shift to the input signal at a predetermined frequency;
    feedback means for the amplification means for sustaining oscillation at the predetermined frequency;
    means for providing an output signal at the predetermined frequency; and
    means for receiving a mirror reference signal, the mirror reference signal being for controlling a relative degree of phase shift of the amplification means, the mirror reference signal being a function of the input signal and a current reference signal.

2. A circuit as claimed in claim 1 including at least three amplification stages.

3. A circuit as claimed in claim 1 wherein the amplification means includes a first amplification stage generating a phase shift of 270°, such stage of amplification including integrator means, and a second amplification stage for generating a phase shift of 90°, such second amplification stage including second integrator means, and a third amplification stage constituting an output amplifier for the output signal from the second amplification stage.

4. A circuit comprising:
    means for receiving an input signal for amplification;
    multiple amplification stages;
    feedback means for the amplification stages for developing and sustaining oscillation of a signal at a predetermined frequency;
    gain control means for developing a gain level for permitting oscillation under conditions including at least the condition of power turn-on of the circuit and other operating conditions, the gain control means including multiple gain means such that a first gain control means regulates an amplification stage, a second gain control means for controlling an overall gain of the multiple amplification stages, and an intermediate gain control means for reducing a net overall gain of the amplification stages to unity;
    means for outputting an amplified signal; and
    means for receiving a mirror reference signal, the mirror reference signal being for controlling the relative degrees of phase shift of the respective amplification stages, the mirror reference signal being a function of the input signal and a current reference signal.

5. A circuit as claimed in claim 4 wherein the intermediate gain control means includes a transistor and resistor network for adjusting gain to sustain oscillation.

6. A circuit as claimed in claim 5 wherein the intermediate gain control means is a non-linear gain control means.

7. A circuit as claimed in claim 5 including means for controlling an amplitude of an oscillating signal in response to a selected input reference signal.

8. A circuit as claimed in claim 4 wherein a gain control is affected by a secondary feedback means, such feedback means being substantially independent of the multiple amplification stages, and the first gain control means regulates an output amplification stage.

9. A circuit as claimed in claim 1 including gain control means for developing a gain level for permitting oscillation under conditions including power turn-on, and other operating conditions.

10. A circuit as claimed in claim 2 including gain control means for developing a gain level for permitting oscillation under conditions including power turn-on, and other operating conditions.

11. A circuit as claimed in claim 3 including gain control means for developing a gain level for permitting oscillation under conditions including power turn-on, and other operating conditions.

12. A circuit as claimed in claim 4 including gain control means for developing a gain level for permitting oscillation under conditions including power turn-on, and other operating conditions.

13. A circuit as claimed in claim 1 including gain control means, such gain control means including a transistor and resistor network for adjusting gain to sustain oscillation.

14. A circuit as claimed in claim 1 including gain control means, the gain control means being associated with an intermediate amplification stage.

15. A circuit as claimed in claim 1 including gain control means, the gain control means including means for controlling an amplitude of an oscillation signal in accordance with an input signal.

16. A circuit as claimed in claim 4 wherein the gain control means adjusts oscillator operating condition such that the oscillator output generates two sinusoidal waveforms in quadrature.

17. A circuit as claimed in claim 1 including a preamplifier, the preamplifier providing means for generating a control signal for linearly varying the predetermined oscillation frequency.

18. A circuit as claimed in claim 17 wherein the variation of the predetermined oscillator frequency generates a signal for providing an FM signal for implementing a FM transmission link.

19. A circuit as claimed in claim 17 including means for converting an input signal to a linear control current for the predetermined oscillator frequency, whereby the input signal modulates the oscillator frequency substantially independently of other signals.

20. A circuit as claimed in claim 17 including control means for modulating the preamplifier with a signal, such signal being at a relatively lower frequency for introducing an offset frequency into a carrier frequency as determined by the predetermined oscillator frequency.

21. A circuit as claimed in claim 2 wherein the amplification stages include a transconductance control with each stage.

22. A circuit as claimed in claim 4 wherein the multiple amplification stages are based on a transconductance control of each stage.

23. A circuit as claimed in claim 1 including a transmitter for transmitting a signal generated by the circuit, the transmitter being a FM transitter means for transmitting the signal to a FM receiver.

24. A circuit as claimed in claim 4 including a FM transmitter for transmitting an input signal to a FM receiver means.

25. A circuit as claimed in claim 1 wherein the input signal is a signal representative of a parameter associated with a medical condition of a patient.

26. A circuit as claimed in claim 4 wherein the input signal is a signal representative of a parameter associated with a medical condition of a patient.

27. A circuit as claimed in claim 23 wherein the input signal is a signal representative of a parameter associated with a medical condition of a patient.

28. A circuit as claimed in claim 24 wherein the input signal is a signal representative of a parameter associated with a medical condition of a patient.

29. An electrical circuit comprising:
means for receiving an input signal for amplification;
multiple amplification stages including a transconductance amplifier for amplifying the input signal;
means for having the input signal modulate the amplification stages by varying the transconductance of the transconductance amplifier to provide a 360° phase shift to the input signal at a predetermined frequency;
feedback means for the multiple amplification stages for sustaining oscillation at the predetermined frequency;
gain control means for developing a gain level for permitting oscillation, the gain control means including multiple gain means such that a first gain control means regulates an amplification stage, a second gain control means for controlling an overall gain of the multiple amplification stages, and an intermediate gain control means for reducing a net overall gain of the amplification stages to unity;
means for providing an output signal at the predetermined frequency; and
means for receiving a mirror reference signal, the mirror reference signal being for controlling the relative degrees of phase shift of the respective amplification stages, the mirror reference signal being a function of the input signal and a current reference signal.

30. A circuit as claimed in claim 29 wherein the intermediate gain control means includes a transistor and resistor network for adjusting the net overall gain to sustain oscillation.

31. A circuit as claimed in claim 29 wherein the intermediate gain control means is a non-linear gain control means.

* * * * *

UNITED STATES PATENT AND TRADEMARK OFFICE
CERTIFICATE OF CORRECTION

PATENT NO. : 5,414,392

DATED : May 9, 1995

INVENTOR(S) : Schupak

It is certified that error appears in the above-identified patent and that said Letters Patent is hereby corrected as shown below:

On title page,

Item [54] delete "AMPLIFIER CIRCUIT" and insert --TRANSCONDUCTANCE AMPLIFIER CIRCUIT USING INPUT SIGNAL TO MODULATE THE AMPLIFICATION-- therefor.

Column 1, title, delete "AMPLIFIER CIRCUIT" and insert --TRANSCONDUCTANCE AMPLIFIER CIRCUIT USING INPUT SIGNAL TO MODULATE THE AMPLIFICATION-- therefor.

Column 5, line 28, delete "$Fouta$" and insert --$Fout \propto$-- therefor; delete "$(Gmt/cC)$" and insert --$(Gmt/C)$-- therefor.

Column 6, line 29, delete the minus sign "-" after the plus sign "+".

Signed and Sealed this

Seventh Day of November, 1995

Attest:

BRUCE LEHMAN

Attesting Officer

Commissioner of Patents and Trademarks